(12) United States Patent
Fricke et al.

(10) Patent No.: US 6,570,795 B1
(45) Date of Patent: May 27, 2003

(54) DEFECTIVE MEMORY COMPONENT OF A MEMORY DEVICE USED TO REPRESENT A DATA BIT IN A BIT SEQUENCE

(75) Inventors: Peter Fricke, Corvallis, OR (US); Andrew L. Van Brocklin, Corvallis, OR (US); Daryl Anderson, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/120,473

(22) Filed: Apr. 10, 2002

(51) Int. Cl.[7] ................................................. G11C 7/00
(52) U.S. Cl. ....................................... 365/200; 365/100
(58) Field of Search ................................ 365/200, 100, 365/96, 103, 94, 105

(56) References Cited

U.S. PATENT DOCUMENTS

| | | | | | |
|---|---|---|---|---|---|
| 3,582,908 A | * | 6/1971 | Koo | ............................ | 365/100 |
| 3,863,231 A | * | 1/1975 | Taylor | ........................ | 365/100 |
| 4,442,507 A | * | 4/1984 | Roesner | ....................... | 365/100 |
| 5,539,697 A | | 7/1996 | Kim et al. | .................... | 365/200 |

* cited by examiner

Primary Examiner—Michael S. Lebentritt
Assistant Examiner—Anh Phung

(57) ABSTRACT

A memory device includes memory components that represent a logic value corresponding to a data bit in a bit sequence. A defective memory component in the memory device represents a data bit in the bit sequence. An additional memory component in the memory device represents an encode bit in the bit sequence, where the encode bit indicates whether the bit sequence is inverted.

50 Claims, 9 Drawing Sheets

DEFECTIVE MEMORY COMPONENT OF A MEMORY DEVICE USED TO REPRESENT A DATA BIT IN A BIT SEQUENCE

TECHNICAL FIELD

This invention relates to memory devices.

BACKGROUND

Conventional read-only memory (ROM) circuits are implemented as special-purpose integrated circuits for the permanent storage of program instructions and data. For example, a ROM circuit can be manufactured with specific instructions for the operation of a computer system.

Typically, a ROM circuit consists of an array of memory cells on a semiconductor, and each memory cell has a transistor that is fabricated to indicate a logic "one" or a logic "zero" based on how the semiconductor is implanted to create the transistor. The data is permanently stored with a memory cell, and it cannot then be erased or altered electrically. Each of the transistors can be formed so as to have one of the two predetermined logic values.

A programmable ROM (PROM) circuit is designed with memory cells having programmable memory components that can be programmed after the semiconductor chip has been manufactured. The memory cells of a PROM device are programmed with data (e.g., a logic one or a logic zero) when the instructions are burned into the chip. This is accomplished by forming contacts that define the threshold voltage levels near the end of the manufacturing process, or after the manufacturing process. When a PROM device is programmed, the device can be implemented like a conventional ROM chip in that the data cannot be electrically altered.

A semiconductor memory device is typically fabricated with extra rows and columns of memory cells that are used to replace rows and/or columns having defective memory cells that cannot be repaired. A single defective memory cell can result in thousands of otherwise non-defective memory cells being unusable. Further, the extra rows and columns of memory cells increase manufacturing expenses to account for defective memory cells such that the memory device can yield its designed capacity. If a memory device has more defective memory cells than can be replaced with the redundant rows and columns, the entire memory device is unusable for its intended application.

Due to the costs of fabricating semiconductor devices, and the design of smaller integrated circuit-based electronic devices, there is an ever-present need to provide non-volatile memory circuits that take up less space, have improved memory storage capacity, and are inexpensive to manufacture.

SUMMARY

A memory device includes memory components that represent a logic value corresponding to a data bit in a bit sequence. A defective memory component in the memory device represents a data bit in the bit sequence. An additional memory component in the memory device represents an encode bit of the bit sequence, where the encode bit indicates whether the bit sequence is inverted.

BRIEF DESCRIPTION OF THE DRAWINGS

The same numbers are used throughout the drawings to reference like features and components.

DETAILED DESCRIPTION

Figure 1:
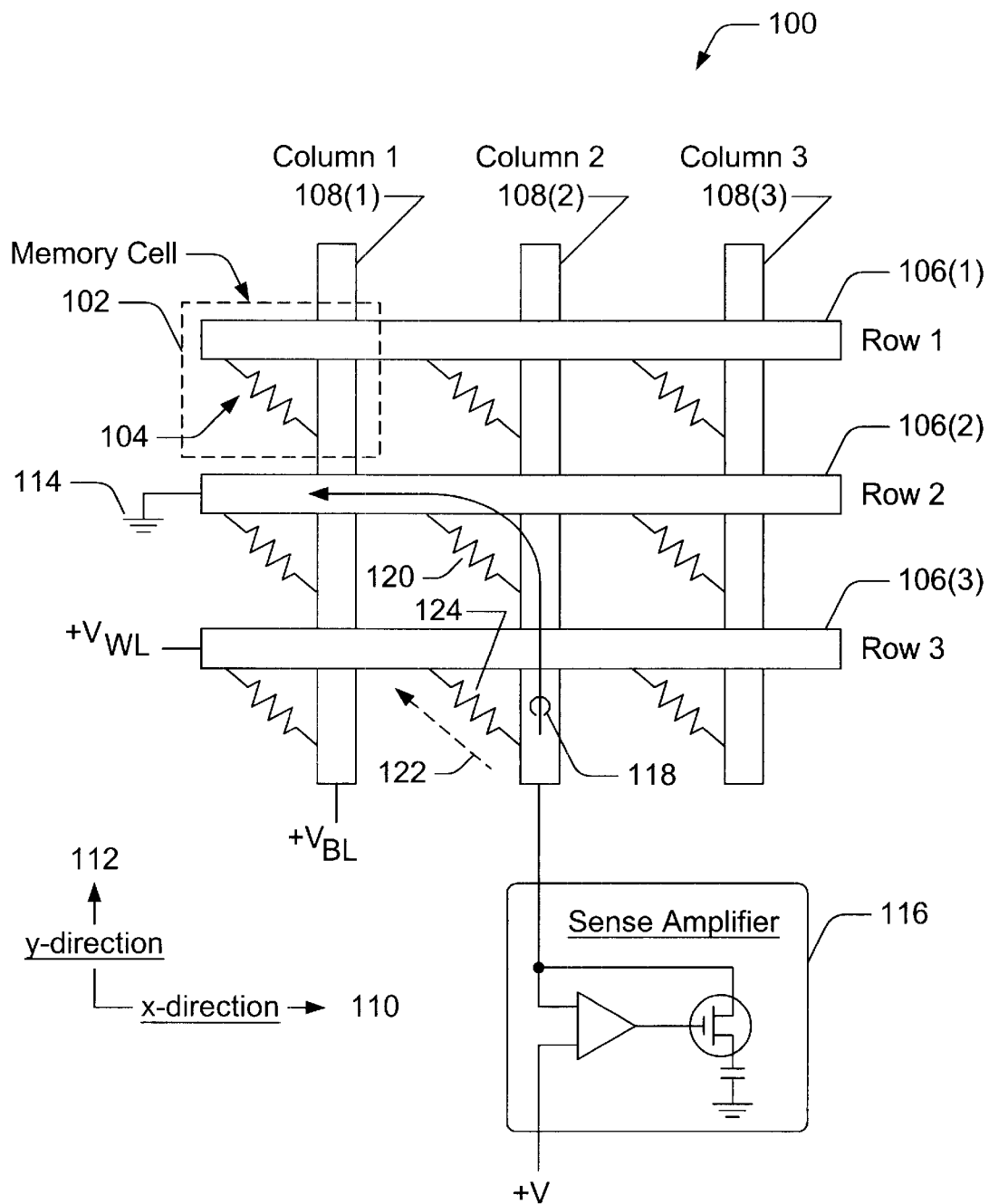
FIG. 1 illustrates a non-volatile memory array having memory cells that include a resistor memory component.

The following describes data optimization techniques for storing data in a memory device having one or more defective memory cells, and retrieving the data from the memory device. By being able to utilize defective memory cells to store data bits of bit sequences, the memory devices take up less space in electronic devices because they can be fabricated with fewer redundant rows and/or columns of memory cells, or without the redundant rows and columns of memory cells. Further, the memory devices are less expensive to manufacture. Less expensive and smaller memory devices provide greater design flexibility for integrated circuit-based electronic devices.

A memory device includes memory components that represent a logic value corresponding to a data bit in a bit sequence. A defective memory component in the memory device represents a data bit in the bit sequence. An additional memory component in the memory device represents an encode bit of the bit sequence, where the encode bit indicates whether the bit sequence is inverted.

In one embodiment, the additional memory component represents a logic one encode bit to indicate that the logic state of each data bit in the bit sequence is inverted. Alternatively, the additional memory component represents a logic zero encode bit to indicate that the logic state of each data bit in the bit sequence is not inverted.

In one embodiment of data optimization, the bit sequence is represented by the memory components and for a bit sequence having one or more logic zero data bits, one or more of the memory components are programmed to represent the logic zero data bits in the bit sequence. When programmed, the memory components are converted from an initial first resistance, such as a high resistance for example, to a second resistance, such as a low resistance that represents a logic zero. The defective memory component also represents a logic zero data bit in the bit sequence, and the encode bit indicates that the bit sequence is not inverted.

In one embodiment of inverted data optimization, the logic state of each data bit in the bit sequence is inverted to form an inverted bit sequence. The defective memory component represents a logic zero data bit in the inverted bit sequence, and the encode bit indicates that the bit sequence is inverted. If the inverted bit sequence has one or more logic zero data bits, one or more of the memory components are programmed to represent the logic zero data bits in the inverted bit sequence.

General reference is made herein to various examples of memory devices. Although specific examples may refer to memory devices having particular memory component implementations, such examples are not meant to limit the scope of the claims or the description, but are meant to provide a specific understanding of the data optimization techniques described herein. Furthermore, it is to be appreciated that the described memory components are exemplary, and are not intended to limit application of the data optimization techniques. Accordingly, other memory devices having components different from and/or in addition to those described herein can be used to implement the described data optimization techniques.

Exemplary Memory Devices

FIG. 1 illustrates a section of an exemplary non-volatile memory device 100 that includes an array of pre-programmed memory cells implemented with resistor components. An individual memory cell 102 has a resistor memory component 104 that is connected between a row of conductive material 106(1) and a column of conductive material 108(1).

The memory cells (i.e., a resistor component connected between conductive traces) are arranged in rows extending along an x-direction 110 and in columns extending along a y-direction 112. Only a few memory cells of memory device 100 are shown to simplify the description. In practice, memory device 100 can be implemented as a ROM (read-only memory) device having multiple memory cell arrays and/or multiple layers of memory cell arrays stacked vertically. Additionally, the rows of conductive material 106 and the columns of conductive material 108 do not have to be fabricated perpendicular to each other as illustrated in FIG. 1. Those skilled in the art will recognize the various fabrication techniques and semiconductor design layouts that can be implemented to fabricate memory device 100.

The rows of conductive material 106 are traces that function as word lines extending along the x-direction 110 in the array of memory cells. The columns of conductive material 108 are traces that function as bit lines extending along the y-direction 112 in the array of memory cells. There can be one word line for each row of the array and one bit line for each column of the array. Each memory cell is located at a cross point of a corresponding word line and bit line, where a memory cell represents a bit of information which translates to a logic one, or to a logic zero.

The resistance value of any one resistor memory component 104 connected between conductive traces can be designed to be relatively high (e.g. 10 Meg ohms), which translates to a logic bit value of one, or relatively low (e.g. 100K ohms), which translates to a logic bit value of zero. Correlating a relatively high resistance memory component with a logic one, and a relatively low resistance memory component with a logic zero is an implementation design choice. Accordingly, a relatively high resistance memory component can be defined as a logic zero and a relatively low resistance memory component can be defined as a logic one.

The resistance value of a selected memory cell is determinable and can be sensed by applying a voltage to the memory cell and measuring the current that flows through the memory component in the memory cell. The resistance value is proportional to the sense current. During a read operation to determine the resistance value of a memory component in a memory cell, a row decoder (not shown) selects a word line 106(2) by connecting the word line to ground 114. A column decoder (not shown) selects a bit line 108(2) to be connected to a sense amplifier 116 that applies a positive voltage, identified as +V, to the bit line 108(2). The sense amplifier 116 senses the different resistance values of the resistor memory components in selected memory cells in the array of memory cells. The sense amplifier 116 can be implemented with sense amplifiers that include a differential, analog, or digital sense amplifier.

All of the other unselected word lines (i.e., rows 106) are connected to a constant voltage source, identified as $+V_{WL}$, which is equivalent to the positive voltage +V. Additionally, all of the other unselected bit lines (i.e., columns 108) are connected to a constant voltage source, identified as $+V_{BL}$, which is also equivalent to the positive voltage +V. The constant voltage sources $+V_{WL}$ and $+V_{BL}$ can be supplied from an external circuit, or circuits, to apply an equipotential to prevent current loss. Those skilled in the art will recognize that voltage sources $+V_{WL}$ and $+V_{BL}$ do not have to be equipotential, and that current loss can be prevented with any number of circuit implementations.

Applying equal potentials to the selected and unselected word and bit lines reduces parasitic currents. For example, a signal current 118 flows through resistor memory component 120 when determining the resistance value of the memory component. If the equipotential voltage $+V_{WL}$ applied to row 106(3) is less than selection voltage +V, an unwanted parasitic current 122 will flow through resistor memory component 124.

Figure 2:
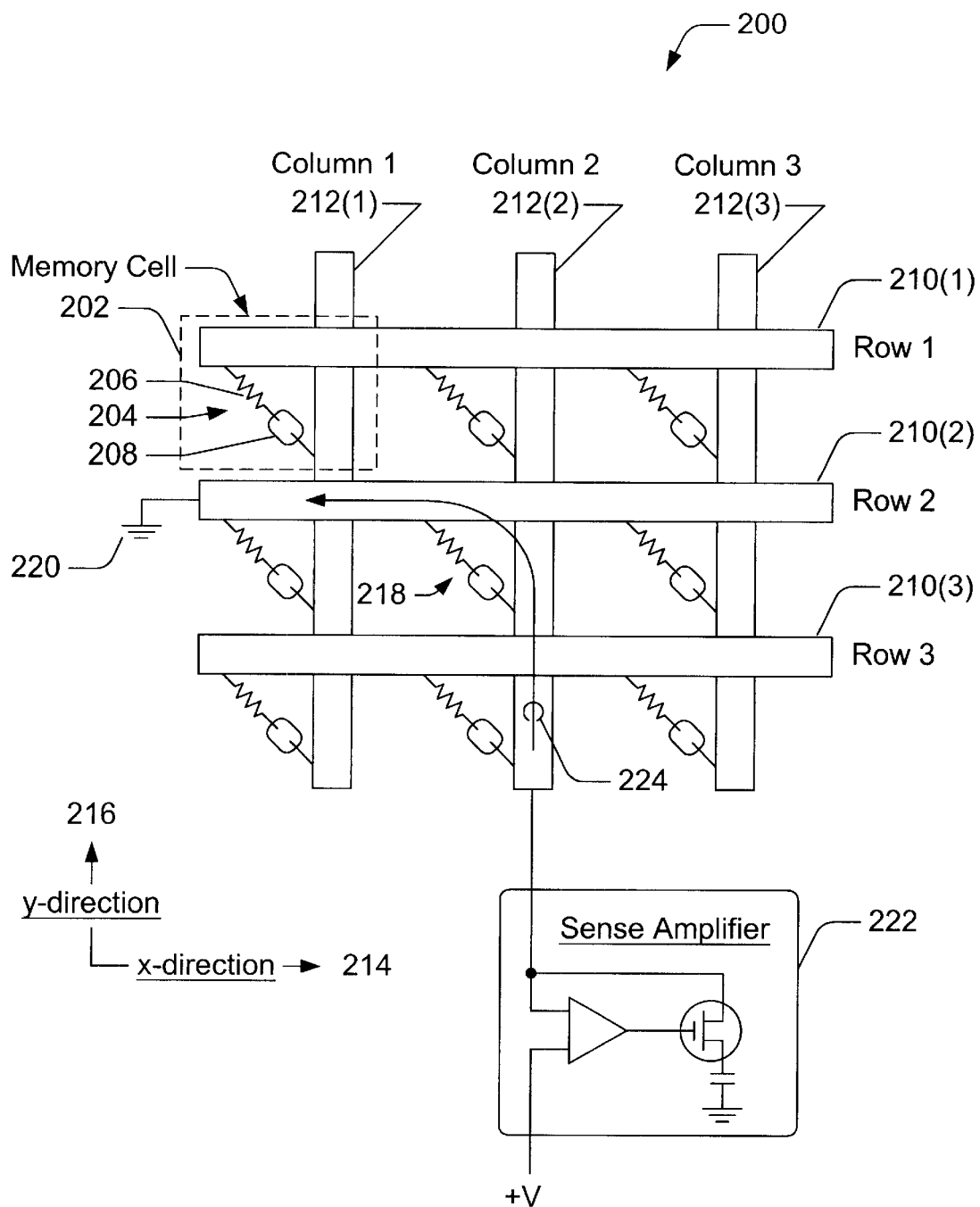
FIG. 2 illustrates a non-volatile memory array having memory cells that include a resistor in series with a control element.

FIG. 2 illustrates a section of an exemplary non-volatile memory device 200 that includes an array of pre-programmed memory cells. In memory array 200, an individual memory cell 202 has a memory component 204 that is implemented with a resistor 206 connected in series with a control element 208. The memory component 204 is connected between a row of conductive material 210(1) and a column of conductive material 212(1). The control element 208 in memory component 204 functions to allow the selection of a particular memory cell in a memory cell array. The control element 208 can be implemented with a linear or nonlinear resistor, a tunnel junction oxide, a tunnel junction diode, a tunnel diode, a Schottky, PN, or PIN semiconductor diode, and the like.

The memory cells (i.e., a memory component connected between conductive traces) are arranged in rows extending along an x-direction 214 and in columns extending along a y-direction 216. Only a few memory cells of memory device 200 are shown to simplify the description. In practice, memory device 200 can be implemented as a ROM device or as a logic device having multiple memory cell arrays and/or multiple layers of memory cell arrays stacked vertically. Additionally, the rows of conductive material 210 and the columns of conductive material 212 do not have to be fabricated perpendicular to each other as illustrated in FIG. 2. Those skilled in the art will recognize the various fabrication techniques and semiconductor design layouts that can be implemented to fabricate memory device 200.

The rows of conductive material 210 are traces that function as word lines extending along the x-direction 214 in the array of memory cells. The columns of conductive material 212 are traces that function as bit lines extending along the y-direction 216 in the array of memory cells. There can be one word line for each row of the array and one bit line for each column of the array. Each memory cell is located at a cross point of a corresponding word line and bit line, where a memory cell stores a bit of information which translates to a logic one, or to a logic zero.

As described above, the resistance value of any one memory component (i.e., a resistor connected in series with a control element) connected between conductive traces can be designed to be relatively high (e.g. 10 Meg ohms), which translates to a logic bit value of one, or relatively low (e.g. 100K ohms), which translates to a logic bit value of zero. Correlating a relatively high resistance memory component with a logic one, and a relatively low resistance memory component with a logic zero is an implementation design choice, and the correlation can be reversed.

The resistance value of a selected memory cell can be determined by applying a voltage to the memory cell and measuring the current that flows through the memory component in the memory cell. For example, to determine the resistance value of memory component 218, word line 210(2) is connected to ground 220, and bit line 212(2) is connected to a sense amplifier 222 that applies a positive voltage, identified as +V, to the bit line 212(2). The sense amplifier 222 senses the resistance value of memory component 218 which is proportional to a signal current 224 that flows through memory component 218.

Figure 3:
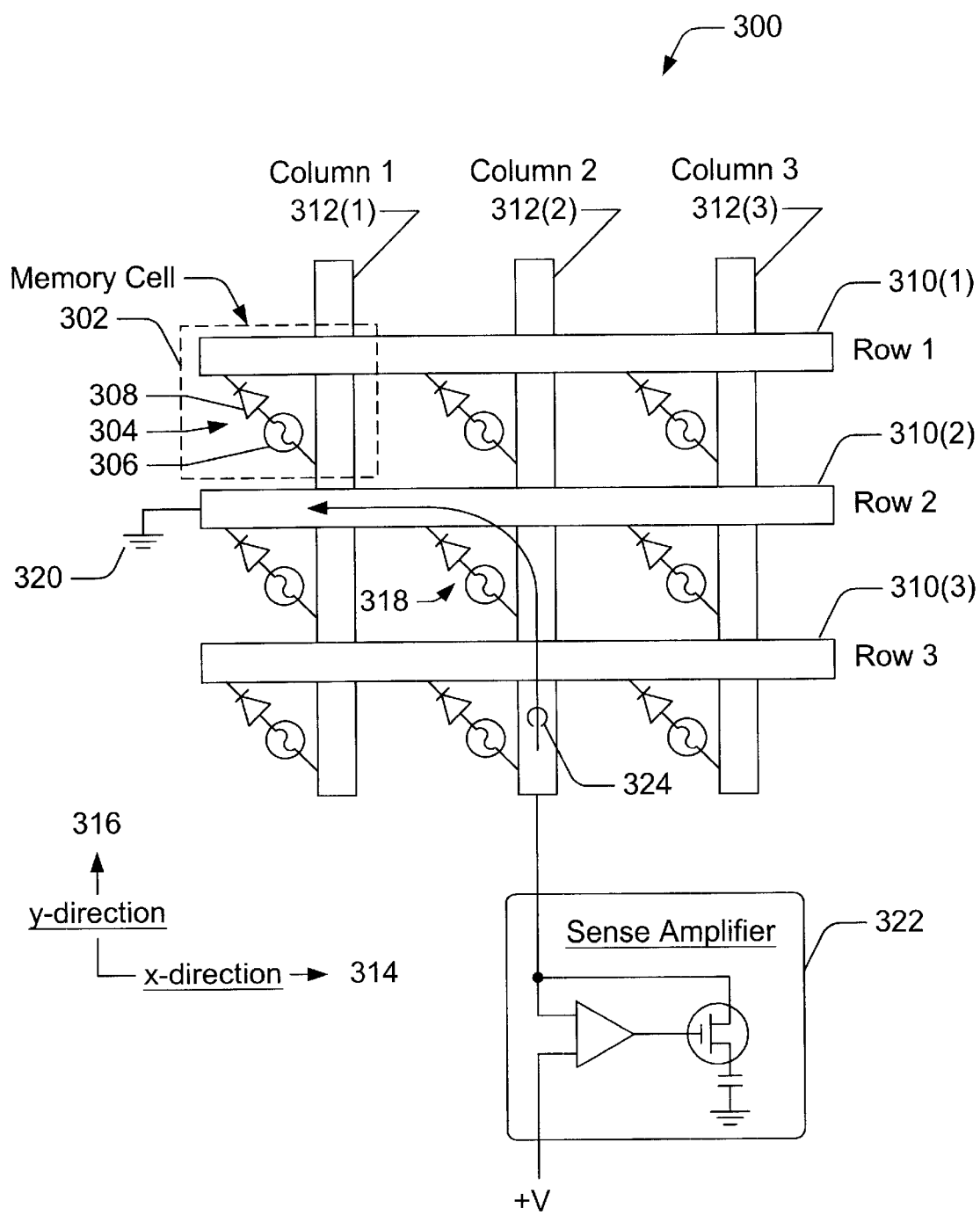
FIG. 3 illustrates a non-volatile memory array having programmable, write-once memory cells that include an anti-fuse device in series with a diode.

FIG. 3 illustrates a section of an exemplary non-volatile memory device 300 that includes an array of programmable, write-once memory cells. In memory array 300, an individual memory cell 302 has a memory component 304 that is implemented with an anti-fuse device 306 connected in series with a diode 308. The memory component 304 is connected between a row of conductive material 310(1) and a column of conductive material 312(1).

Anti-fuse device 306 is a tunnel-junction, one-time programmable device. The tunnel-junction of the anti-fuse device is a thin oxide junction that electrons "tunnel" through when a pre-determined, relatively high potential is applied across the anti-fuse device. The applied potential causes an electrical connection when the oxide junction is destroyed creating a short having a low resistance value. Anti-fuse device 306 can be implemented with any number of available components and types of fuses or anti-fuses, such as a LeComber, Silicide, Tunnel Junction, Oxide Rupture, or any other similar fuse components. Although not shown, diode 308 can be replaced in a memory component 304 with a control element implemented with a linear or nonlinear resistor, a tunnel junction oxide, a tunnel junction diode, a tunnel diode, a Schottky, PN, or PIN semiconductor diode, and the like.

Each memory cell of memory device 300 can be fabricated with an anti-fuse device that indicates a high resistance value when a relatively low voltage is applied across the anti-fuse device to read a particular memory cell. A selected memory cell can be programmed by applying a relatively high potential across the anti-fuse device to fuse the tunnel-junction in the device. When an anti-fuse device is programmed, it will indicate a low resistance when a relatively low voltage is applied across the particular memory cell. The anti-fuse devices can be utilized as programmable switches that allow memory device 300 to be implemented as a programmable logic device. The anti-fuse devices can be utilized as both logic elements and as routing interconnects. Unlike traditional switching elements, the anti-fuse devices can be optimized to have a very low resistance once programmed which allows for high-speed interconnects and lower power levels.

The memory cells (i.e., a memory component connected between conductive traces) are arranged in rows extending along an x-direction 314 and in columns extending along a y-direction 316. Only a few memory cells of memory device 300 are shown to simplify the description. In practice, memory device 300 can be implemented as a ROM device or as a logic device, such as a one-time programmable gate array. The functionality of such a gate array would be similar to that of a field programmable gate array (FPGA) which is an integrated circuit that can be programmed after manufacture. Additionally, the rows of conductive material 310 and the columns of conductive material 312 do not have to be fabricated perpendicular to each other. Those skilled in the art will recognize the various fabrication techniques and semiconductor design layouts that can be implemented to fabricate the memory device 300.

The rows of conductive material 310 are traces that function as word lines extending along the x-direction 314 in the array of memory cells. The columns of conductive material 312 are traces that function as bit lines extending along the y-direction 316 in the array of memory cells. There can be one word line for each row of the array and one bit line for each column of the array. Each memory cell is located at a cross point of a corresponding word line and bit line, where a memory cell stores a bit of information which translates to a logic one, or to a logic zero.

The resistance value of any one memory component (i.e., an anti-fuse device connected in series with a diode) connected between conductive traces is a high resistance value when fabricated which translates to a logic bit value of one. The resistance value of a memory component is a low resistance value when a high potential is applied to the tunnel-junction of the anti-fuse device which causes an electrical connection that translates to a logic bit value of zero. As described above, correlating a relatively high resistance memory component with a logic one, and a relatively low resistance memory component with a logic zero is an implementation design choice, and the correlation can be reversed.

The resistance value of a selected memory cell can be determined by applying a voltage to the memory cell and measuring the current that flows through the memory component in the memory cell. For example, to determine the resistance value of memory component 318, word line 310(2) is connected to ground 320, and bit line 312(2) is connected to a sense amplifier 322 that applies a positive voltage, identified as +V, to the bit line 312(2). The sense amplifier 322 senses the resistance value of memory component 318 which is proportional to a signal current 324 that flows through memory component 318.

Exemplary Data Optimization

When a memory device is fabricated, such as any one of memory devices 100, 200, and 300, one or more of the memory cells in the memory devices can be defective. The non-volatile memory devices described herein can be fabricated as semiconductor devices having columns of conductive material, rows of conductive material, and memory components each connected between a row of conductive material and a column of conductive material.

The first layer of a semiconductor memory device is formed on a substrate layer which can be any construction of semiconductive material that is a supporting structure for the memory device. The columns of conductive material and the rows of conductive material can be fabricated with electrically conductive material such as copper or aluminum, or with alloys or doped silicon. The memory components can be implemented with an electrically resistive material, such as an oxide, that forms a resistor memory component 104 as shown in FIG. 1, a resistor memory component 206 in series with a control element 208 as shown in FIG. 2, or an anti-fuse junction device 306 in series with a control element 308 as shown in FIG. 3. Those skilled in the art will recognize that many different combinations of materials and designs are available to fabricate memory devices and the memory components.

The anti-fuse devices 306 of the memory cells in memory device 300 (FIG. 3) have a high resistance when fabricated, and are then programmed as needed to have a low resistance. However, due to manufacturing defects and resistive material inconsistencies, one or more of the memory components 304 can have an anti-fuse device 306 that has a low resistance before being programmed (e.g., the tunnel-junction of an anti-fuse device is shorted or fused during manufacture). These defective memory cells have little or no resistance that correlates to a logic zero and cannot be changed after manufacture to a high resistance state to correlate to a logic one when a data bit is stored in the memory cell.

Figure 4A:
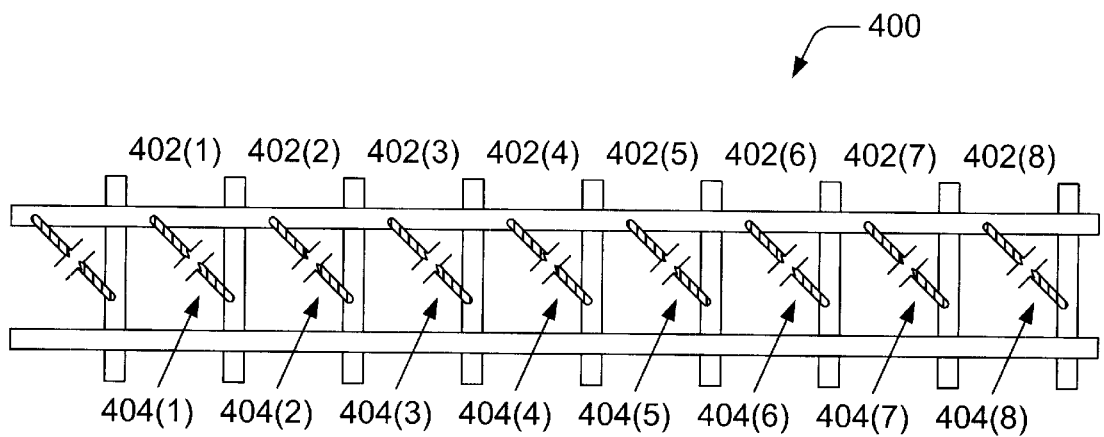
FIGS. 4A and 4B illustrate an embodiment of an array of memory cells programmed to store a bit sequence.

FIG. 4A illustrates an example of a section of a memory device 400 that includes an array of memory cells 402 each having a manufactured high resistance programmable memory component 404. For illustrative purposes, the memory components 404 are each shown as an open conductor to represent a high resistance memory component. A memory component can be implemented to represent a data bit in a bit sequence, or can otherwise be translated, mapped, configured, and/or programmed to correspond to a data bit in a bit sequence.

The memory components 404 (and other memory component examples described herein) can be implemented with any programmable, write-once memory components, such as the exemplary memory component 304 implemented with an anti-fuse device 306 in series with a diode 308 as shown in FIG. 3. Alternatively, the memory components can be implemented with one of many different combinations of materials and designs that are available to fabricate memory cells for memory devices.

Figure 4B:
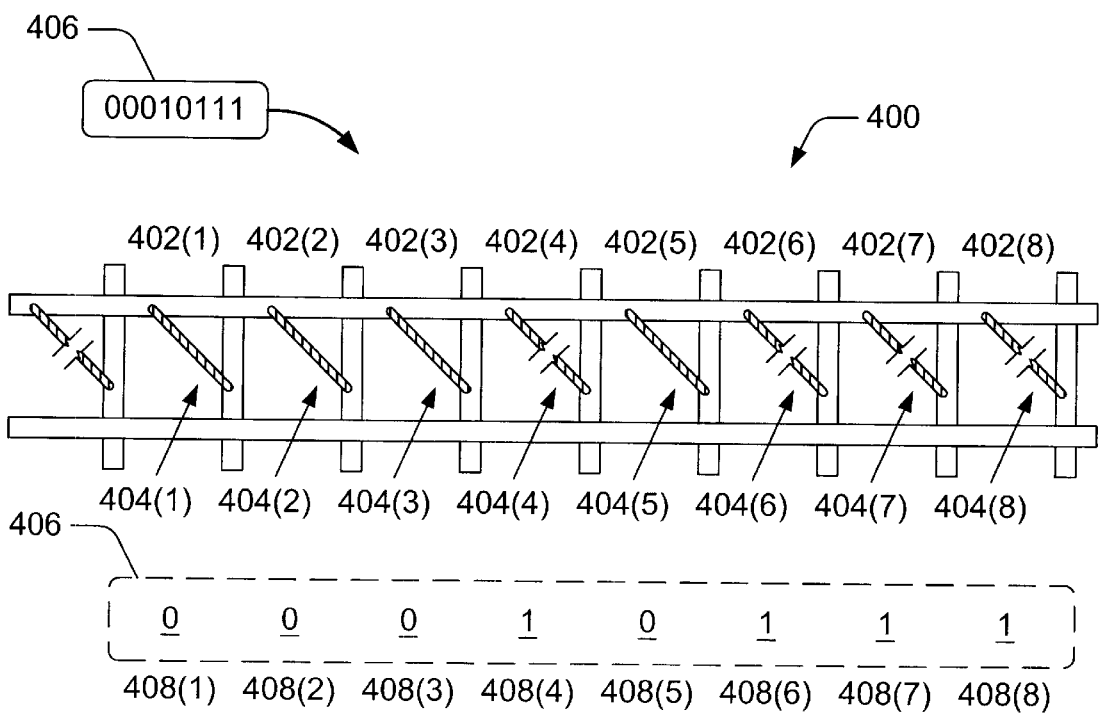

FIG. 4B further illustrates the example section of memory device 400 that includes the array of memory cells 402 programmed to store an eight-bit sequence 406 where each data bit 408 in the eight-bit sequence 406 is shown corresponding to a respective memory cell 402. The eight-bit sequence 406 is "00010111" and memory components 404 (1), 404(2), 404(3), and 404(5) are programmed to have a low resistance corresponding to the logic zero data bits 408(1), 408(2), 408(3), and 408(5). For illustrative purposes, the memory components 404(1), 404(2), 404(3), and 404(5) are each shown programmed as a shorted conductor to represent a low resistance memory component.

Figure 5A:
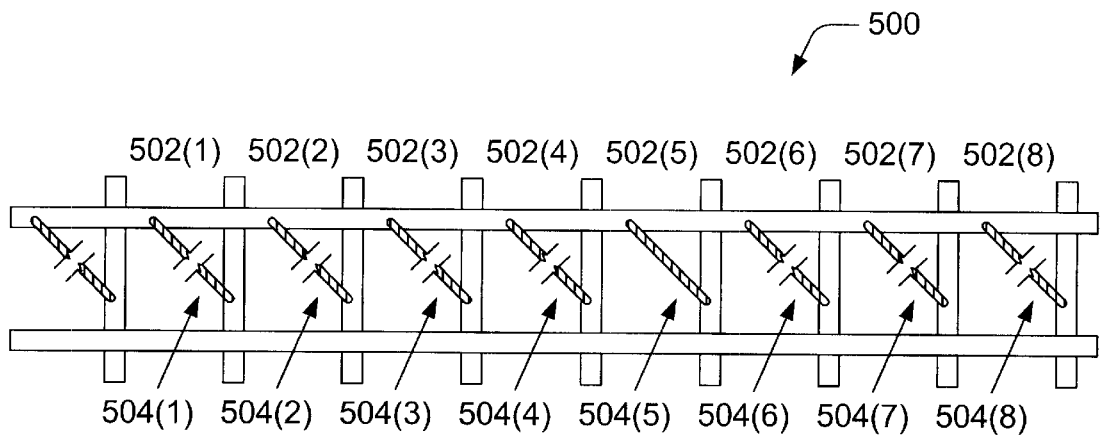
FIGS. 5A, 5B, and 5C illustrate embodiments of data optimization and inverted data optimization with an array of memory cells having a defective memory cell and programmed to store a bit sequence.

FIG. 5A illustrates an example of a section of a memory device 500 that includes an array of memory cells 502 each having a programmable write-once memory component 504. The memory components 504 are manufactured to have a high resistance and the non-defective memory components 504(1–4) and 504(6–8) are each shown as an open conductor to represent a high resistance memory component. Memory component 504(5) is defective and has a low resistance which is shown as a shorted conductor to represent a low resistance memory component.

Figure 5B:
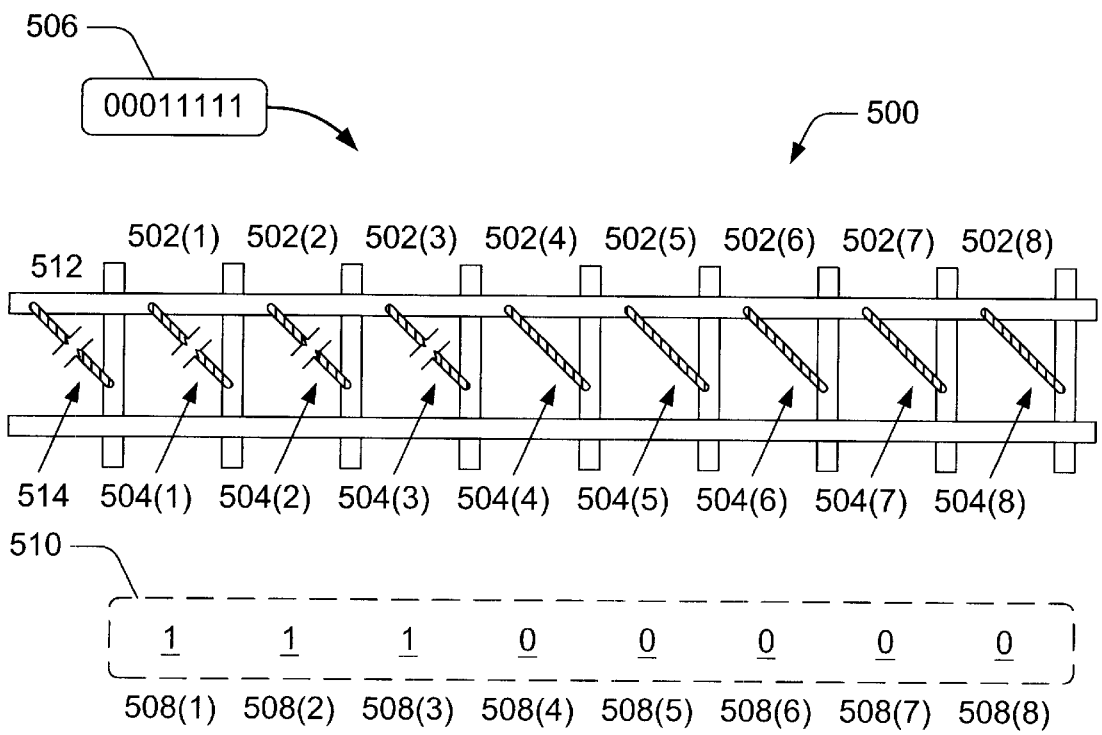

FIG. 5B further illustrates the example section of memory device 500 that includes the array of memory cells 502 programmed to store an eight-bit sequence 506 where each data bit 508 in an inverted eight-bit sequence 510 is shown corresponding to a respective memory cell 502. The eight-bit sequence 506 is "00011111" and memory components 504 are programmed to illustrate an implementation of the inverted data optimization technique that utilizes a defective memory cell to store a data bit. Because memory component 504(5) is a low resistance memory component due to a manufacturing defect, the memory component cannot store the logic one state of data bit 508(5). Thus, the logic state of each data bit in the eight-bit sequence 506 is inverted to form the inverted bit sequence 510 which is "11100000" and the memory components 504 are programmed to store the data bits accordingly.

For example, memory components 504(4), 504(6), 504(7) and 504(8) are programmed to have a low resistance corresponding to the logic zero data bits 508(4), 508(6), 508(7), and 508(8). Memory component 504(5) represents the logic zero data bit 508(5) because the memory component is a low resistance memory component.

The inverted data optimization technique described herein utilizes an additional memory component 512 as an encode bit 514 that corresponds to memory cells 502 and indicates whether the data stored with memory components 504 is inverted. In this example, encode bit 514 is stored as a logic one to indicate that each data bit 508 of the eight-bit sequence 506 is inverted in the array of memory cells 502. Those skilled in the art will recognize that implementing an encode bit as a logic one to indicate inverted bits is merely a design choice, and that an encode bit can be stored as a logic zero to indicate that each data bit of a bit sequence is inverted in an array of memory cells.

Figure 5C:
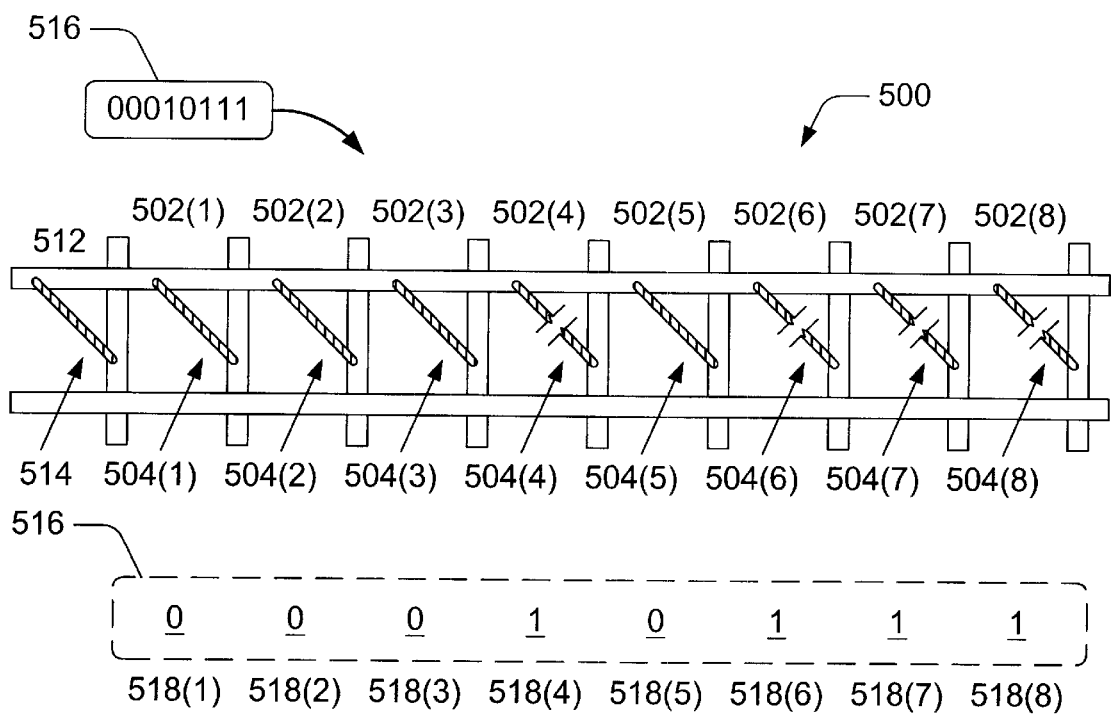

FIG. 5C further illustrates the example section of memory device 500 that includes the array of memory cells 502 programmed to store an eight-bit sequence 516 where each data bit 518 of the eight-bit sequence 516 is shown corresponding to a respective memory cell 502. The eight-bit sequence 516 is "00010111" and memory components 504 (1), 504(2), and 504(3) are programmed to have a low resistance corresponding to the logic zero data bits 518(1), 518(2), and 518(3). Memory component 504(5) represents the logic zero data bit 518(5) because the memory component is a low resistance memory component due to the manufacturing defect. The encode bit 514 in this example is stored as a logic zero to indicate that each data bit 518 of the eight-bit sequence 516 is not inverted in the array of memory cells 502.

Although the examples described herein refer to arrays of memory cells programmed to store an eight-bit sequence of data bits, those skilled in the art will recognize that the data optimization techniques can be implemented to store data bit sequences of any number, such as a two-bit sequence, a sixteen-bit sequence, a thirty-two bit sequence, and the like. Further, it is to be appreciated that more than one encode bit can be implemented to indicate whether the logic state of data bits in a bit sequence are inverted. As described herein, a bit sequence can represent any form of electronic data, such as computer-executable instructions. Additionally, an encode bit can be implemented as any logic value other than a logic one or a logic zero, and can be positioned after a bit sequence or within a bit sequence as well as before a bit sequence as illustrated in FIGS. 5B and 5C.

Exemplary Memory Device Application Environment

Figure 6:
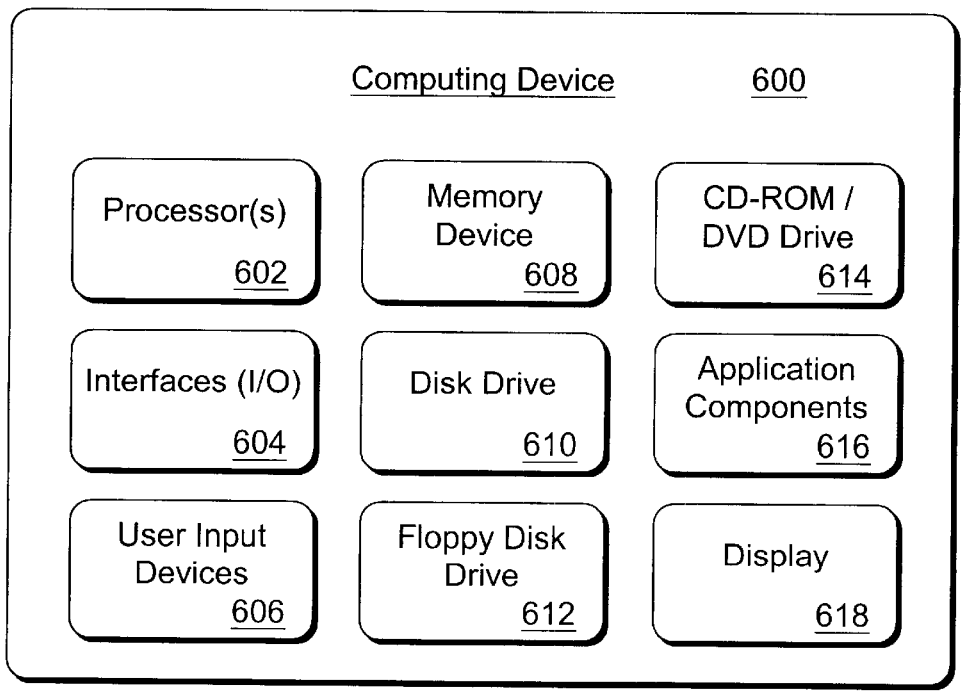
FIG. 6 is block diagram that illustrates various components of an exemplary computing device.

FIG. 6 illustrates various components of an exemplary computing device 600 that can be utilized to implement the data optimization techniques described herein. Computing device 600 is only one memory device application environment, and those skilled in the art will recognize that any number of computing type devices having a memory device can be utilized to implement the data optimization techniques. For example, computing type devices include multifunction devices which, as the name implies, is a device for multiple functions which are related to, but not limited to, printing, copying, scanning, to include image acquisition and text recognition, sending and receiving faxes, print media handling, and/or data communication, either by print media or electronic media, such as email or electronic fax.

Further, computing type devices include, but are not limited to, personal computers, server computers, client devices, microprocessor-based systems, set top boxes, programmable consumer electronics, network PCs, minicomputers, and hand-held portable devices such as a personal digital assistant (PDA), a portable computing device, and similar mobile computing devices.

Computing device 600 includes one or more processors 602, input/output interfaces 604 for the input and/or output of data, and user input devices 606. Processor(s) 602 process various instructions to control the operation of computing device 600, while input/output interfaces 604 provide a mechanism for computing device 600 to communicate with other electronic and computing devices. User input devices 606 can include a keyboard, mouse, pointing device, and/or other mechanisms to interact with, and to input information to computing device 600.

Input/output interfaces 604 can include serial, parallel, and/or network interfaces. A network interface allows devices coupled to a common data communication network to communicate information with computing device 600. Similarly, a communication interface, such as a serial and/or parallel interface, a USB interface, an Ethernet interface, and/or any combination of similar communication interfaces provides a data communication path directly between computing device 600 and another electronic or computing device.

Computing device 600 also includes a memory device 608 (such as ROM and/or MRAM device), a disk drive 610, a floppy disk drive 612, and a CD-ROM and/or DVD drive 614, all of which provide data storage mechanisms for computing device 600. Memory device 608 can be implemented with any one of the memory devices 100 (FIG. 1), 200 (FIG. 2), and 300 (FIG. 3). Those skilled in the art will recognize that any number and combination of memory and storage devices can be connected with, or implemented within, computing device 600. Although not shown, a system bus typically connects the various components within computing device 600.

Computing device 600 also includes application components 616 and can include an integrated display device 618, such as for a multifunction device display on a device control panel, or for a personal digital assistant (PDA), a portable computing device, and similar mobile computing devices. Application components 616 provide a runtime environment in which software applications or components can run or execute on processor(s) 602. Further, an application component 616 can be implemented as a data optimization application to perform the data optimization and inverted data optimization techniques described herein.

For a multifunction implementation of computing device 600, such as for a device that prints, copies, scans, and the like, device 600 can include a print unit that selectively applies an imaging medium such as liquid ink or toner to a print media in accordance with print data corresponding to a print job. Further, device 600 can include a scan unit that can be implemented as an optical scanner to produce machine-readable image data signals that are representative of a scanned image, such as a photograph or a page of printed text. The image data signals produced by scan unit can be used to reproduce the scanned image on a display device or with a printing device.

Methods for Data Optimization

Figure 7:
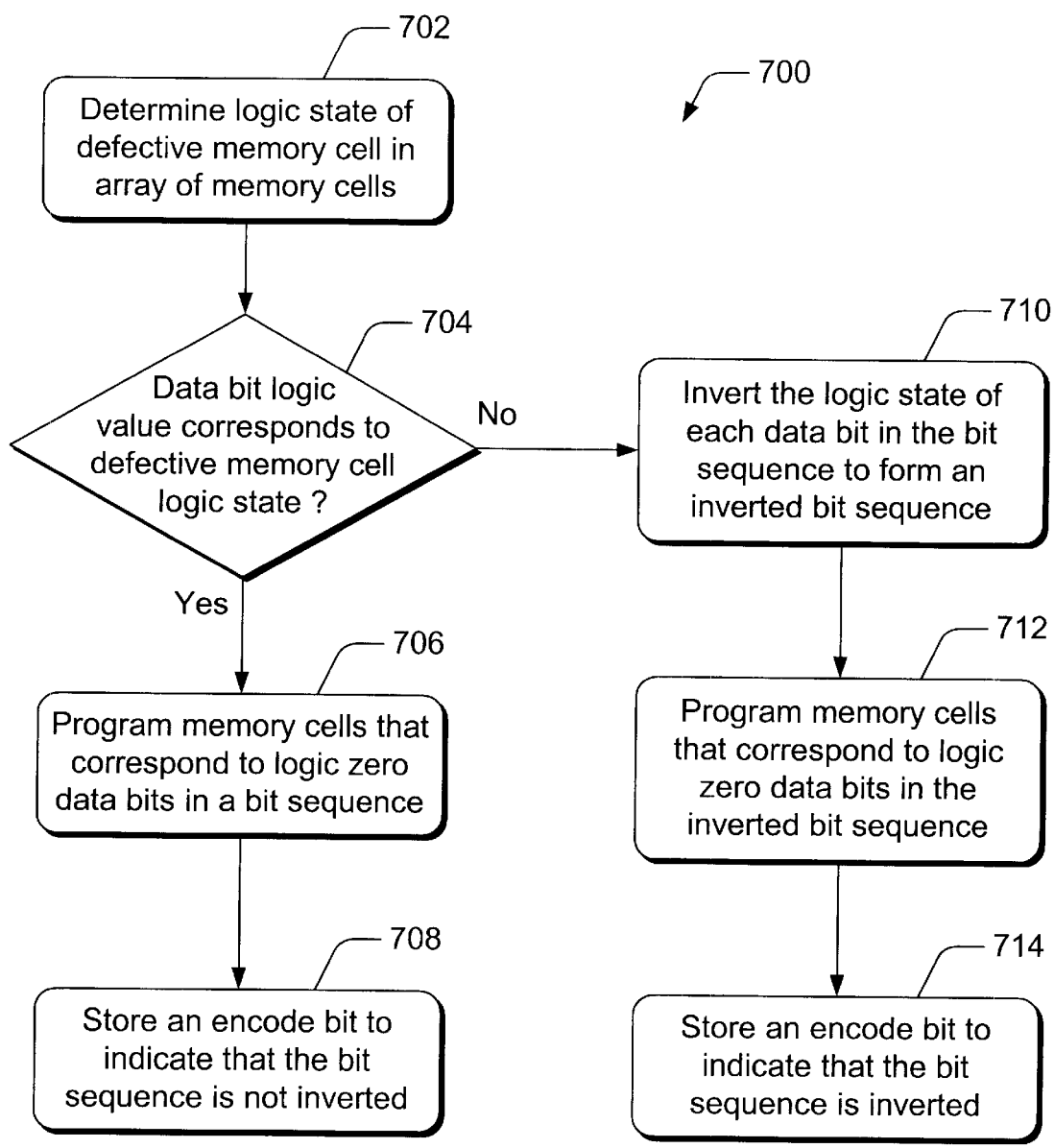
FIG. 7 is a flow diagram that describes a method for storing data bits with implementations of a data optimization technique in a memory device having a defective memory cell.

FIG. 7 illustrates a method 700 for storing data bits with a data optimization technique in a memory device having a defective memory cell. The order in which the method is described is not intended to be construed as a limitation, and any number of the described method blocks can be combined in any order to implement the method for data optimization. Furthermore, the method can be implemented in any suitable hardware, software, firmware, or combination thereof.

At block 702, the logic state of a defective memory cell in an array of memory cells is determined. For example, defective memory cell 502(5) has a low resistance memory component 504(5) (FIG. 5) which is shown as a shorted conductor to represent the low resistance memory component. A low resistance memory component can be implemented to translate to a logic zero state. A defective memory cell can be determined by a data optimization application 616 (FIG. 6) implemented in an electronic device, such as a computing device and/or a printing device. The data optimization application 616 can read a defective memory cell map for a particular memory device which identifies defective memory locations within the memory device. Alternatively, or in addition, the data optimization application 616 can read an un-programmed array of memory components in the memory device before storing a bit sequence to determine if one or more of the memory components are defective.

At block 704, it is determined whether the logic value of a data bit in a bit sequence corresponds to the logic state of the defective memory cell. For example, data optimization application 616 determines whether the logic value of a data bit in bit sequence 506 corresponds to the logic state of defective memory cell 502(5) (FIG. 5B). In this example, data sequence 506 is "00011111" and the fifth data bit from the left is a logic one data bit which does not correspond to the logic zero state of defective memory component 504(5).

Similarly, data optimization application 616 determines whether the logic value of a data bit in bit sequence 516 corresponds to the logic state of defective memory cell 502(5) (FIG. 5C). In this example, data sequence 516 is "00010111" and the fifth data bit from the left is a logic zero data bit which does correspond to the logic zero state of defective memory component 504(5).

If the logic value of the data bit associated with the defective memory cell corresponds to the defective memory cell logic state (i.e., "yes" from block 704), the memory cells of a memory device that are associated with logic zero data bits in the bit sequence are programmed to represent the logic zero data bits at block 706. For example, memory components 504(1), 504(2), and 504(3) are programmed to have a low resistance corresponding to the logic zero data bits 518(1), 518(2), and 518(3) of bit sequence 516 (FIG.

5C). Defective memory component 504(5) represents the logic zero data bit 518(5) because the memory component has a low resistance value. Accordingly, bit sequence 516 is stored in memory cells 502 of memory device 500 and logic zero data bit 518(5) in bit sequence 516 corresponds to the logic state of defective memory cell 502(5).

At block 708, an encode bit associated with the bit sequence is stored to indicate that the bit sequence is not inverted. For example, in FIG. 5C, memory component 514 in memory cell 512 represents a logic zero encode bit (e.g., low resistance memory component) to indicate that the logic state of each data bit 518 in bit sequence 516 is not inverted as represented by memory components 504.

If the logic value of the data bit associated with the defective memory cell does not correspond to the defective memory cell logic state (i.e., "no" from block 704), the logic state of each data bit in the bit sequence is inverted at block 710. For example, the logic state of each data bit in bit sequence 506, which is "00011111", is inverted to form an inverted bit sequence 510, which is "1110000" (FIG. 5B). In this example, the fifth data bit from the left is inverted to a logic zero data bit which corresponds to the logic zero state of defective memory component 504(5).

At block 712, the memory cells of the memory device that are associated with logic zero data bits in the inverted bit sequence are programmed to represent the logic zero data bits. For example, memory components 504(4), 504(6), 504(7) and 504(8) are programmed to have a low resistance corresponding to the logic zero data bits 508(4), 508(6), 508(7), and 508(8) (FIG. 5B). Defective memory component 504(5) represents the logic zero data bit 508(5) of the inverted bit sequence 510 because the memory component has a low resistance value. Accordingly, inverted bit sequence 510 is stored in memory cells 502 of memory device 500 and logic zero data bit 508(5) in bit sequence 510 corresponds to the logic state of defective memory cell 502(5).

At block 714, an encode bit associated with the bit sequence is stored to indicate that the bit sequence is inverted. For example, in FIG. 5B, memory component 514 in memory cell 512 represents a logic one encode bit (e.g., high resistance memory component) to indicate that the logic state of each data bit 508 in the inverted bit sequence 510 is inverted as represented by memory components 504.

Although method 700 describes storing data bits for an eight-bit sequence with the data optimization techniques described herein, those skilled in the art will recognize that the data optimization techniques can be implemented to store data bit sequences of any number, such as a two-bit sequence, a sixteen-bit sequence, a thirty-two bit sequence, and the like. The following Encode Table illustrates an implementation of data optimization for storing two data bits with an encode bit for various correlations between the two data bits and no defective memory cells (i.e., "11"), one or the other defective memory cells (i.e., "01" or "10"), or two defective memory cells (i.e., "00").

For example, when storing bit sequence "01" in two non-defective memory cells "11", the first memory cell is programmed to represent the logic zero data bit. The encode bit represents logic zero to indicate that the bit sequence is not inverted, and the encode bit plus the two data bits are stored as "001", where the encode bit precedes the two data bits (i.e., the encode bit is to the left of the two data bits).

Further, when storing bit sequence "01" in two memory cells and the second memory cell is defective (i.e., "10"), each of the two data bits are inverted from "01" to "10" such that the logic zero data bit corresponds to the zero logic state of the defective memory cell. The encode bit represents logic one to indicate that the bit sequence is inverted, and the encode bit plus the two inverted data bits are stored as "110", where the encode bit precedes the two data bits.

The Encode Table also illustrates that a bit sequence can be stored in an array of memory cells having two or more defective memory cells. For example, data bits "00" can be stored in two defective memory cells (i.e., "00") along with an encode bit that represents logic zero to indicate that the bit sequence "00" is not inverted. Further, data bits "11" can be stored in two defective memory cells (i.e., "00") along with an encode bit that represents logic one to indicate that the bit sequence "11" is inverted.

Encode Table

| Data bit sequence | Memory Cells (0 = defect) | Encode Bit | Stored Data |
|---|---|---|---|
| 00 | 11 | 0 | 000 |
|  | 01 | 0 | 000 |
|  | 10 | 0 | 000 |
|  | 00 | 0 | 000 |
| 01 | 11 | 0 | 001 |
|  | 01 | 0 | 001 |
|  | 10 | 1 | 110 |
|  | 00 | NA | NA |
| 10 | 11 | 0 | 010 |
|  | 01 | 1 | 101 |
|  | 10 | 0 | 010 |
|  | 00 | NA | NA |
| 11 | 11 | 0 | 011 |
|  | 01 | 1 | 100 |
|  | 10 | 1 | 100 |
|  | 00 | 1 | 100 |

Figure 8:
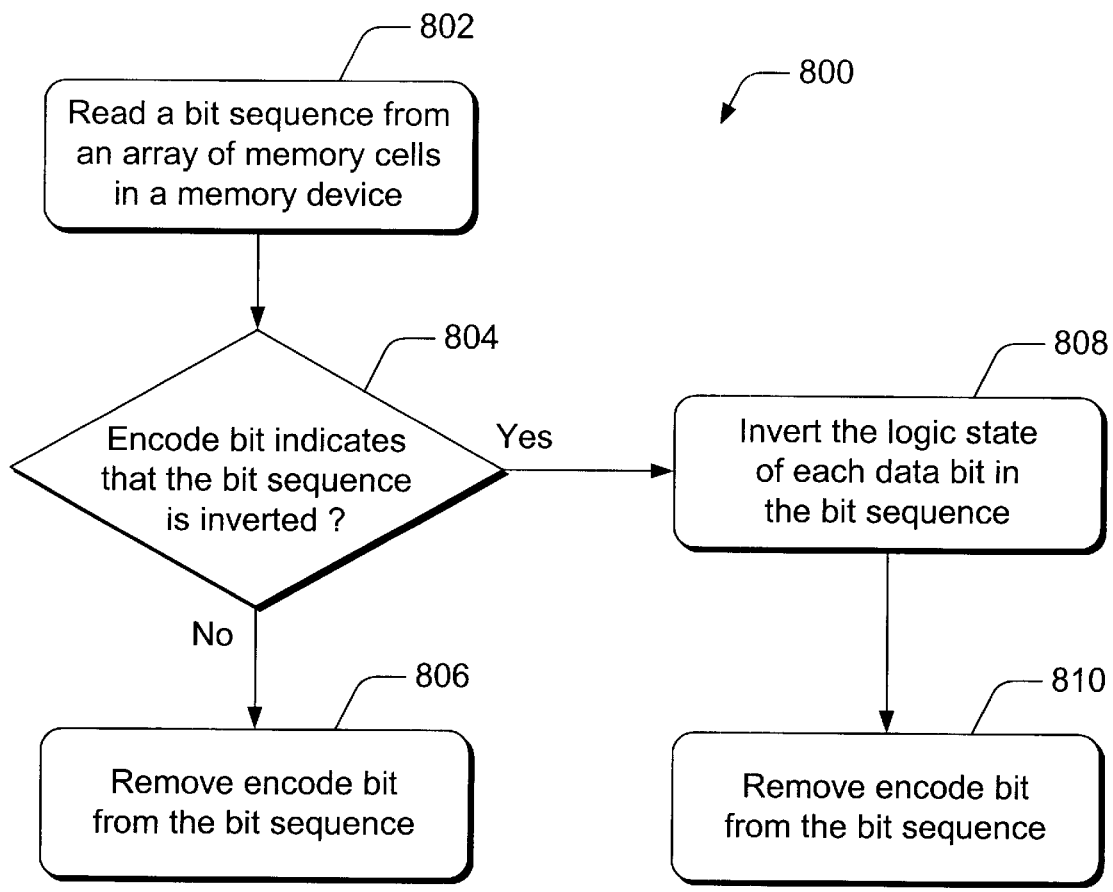
FIG. 8 is a flow diagram that describes a method for retrieving data bits from a memory device having a defective memory cell that was stored with implementations of a data optimization technique.

FIG. 8 illustrates a method 800 for retrieving bit data from a memory device having a defective memory cell that was stored with a data optimization technique as described herein. The order in which the method is described is not intended to be construed as a limitation, and any number of the described method blocks can be combined in any order to implement the method for inverted data optimization. Furthermore, the method can be implemented in any suitable hardware, software, firmware, or combination thereof.

At block 802, a bit sequence is read from an array of memory cells in a memory device. For example, in FIG. 5B, bit sequence 510 is read from memory cells 502 in memory device 500. Further, in FIG. 5C, bit sequence 516 is read from memory cells 502 in memory device 500.

At block 804, it is determined from an encode bit whether the bit sequence is inverted. For example, in FIG. 5B, memory component 514 in memory cell 512 represents a logic one encode bit (e.g., a high resistance memory component) to indicate that the logic state of each data bit 508 in bit sequence 510 is inverted. Further, in FIG. 5C, memory component 514 in memory cell 512 represents a logic zero encode bit (e.g., a low resistance memory component) to indicate that the logic state of each data bit 518 in bit sequence 516 is not inverted.

If the encode bit indicates that the bit sequence is not inverted (i.e., "no" from block 804), the encode bit is removed from the bit sequence at block 806. For example, in FIG. 5C, the logic zero encode bit represented by memory component 514 in memory cell 512 is removed from bit sequence 516 which is "00010111" as represented by memory components 504 in memory cells 502.

If the encode bit indicates that the bit sequence is inverted (i.e., "yes" from block 804), the bit sequence is inverted at block 808. For example, in FIG. 5B, the logic one encode bit represented by memory component 514 in memory cell 512 indicates that the logic state of each data bit 508 in bit sequence 510 is inverted as represented by memory components 504. The logic state of each data bit 508 is inverted from "1110000" to form (or re-form) bit sequence 506 which is "00011111". At block 810, the encode bit is removed from the bit sequence.

Exemplary Multi-Level ROM Devices

Figure 9A:
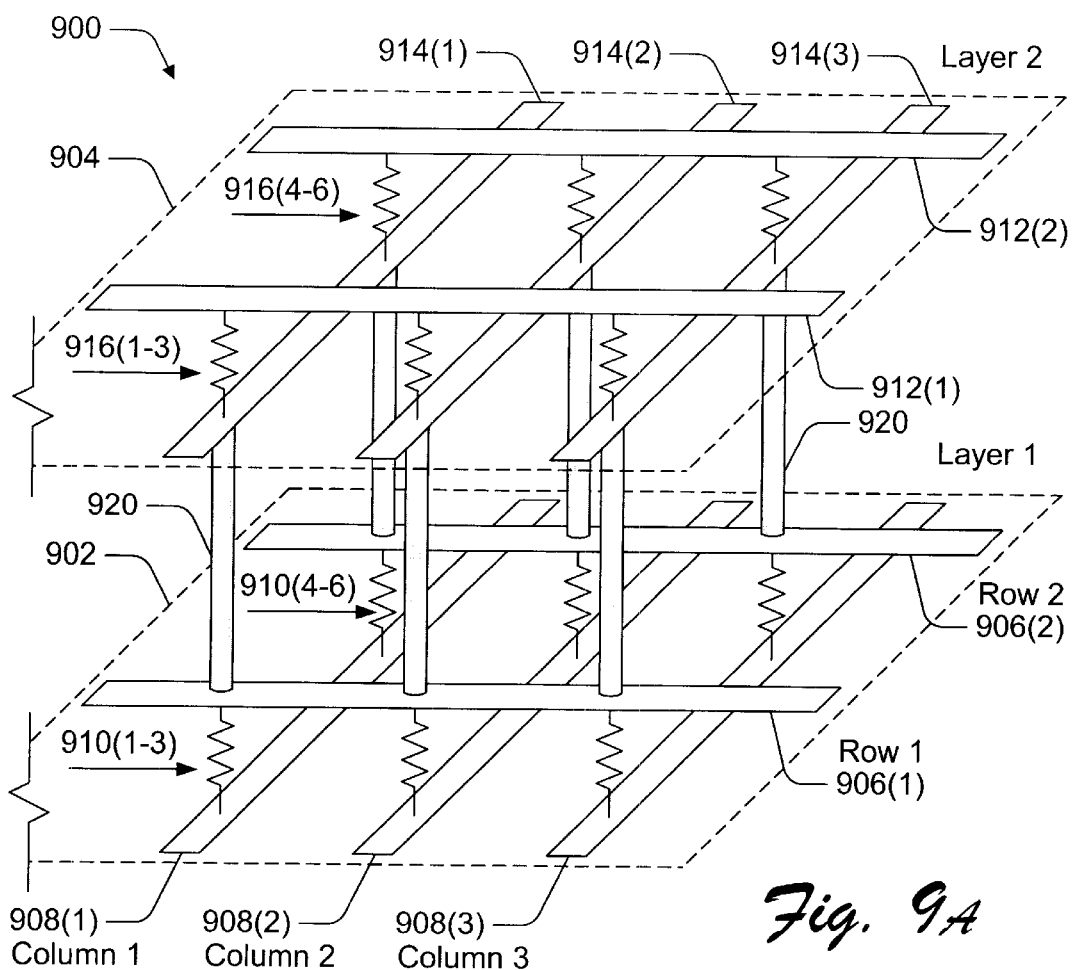
FIGS. 9A and 9B illustrate schematics of a non-volatile, multi-level memory device that can be utilized to implement an embodiment of data optimization.
Figure 9B:
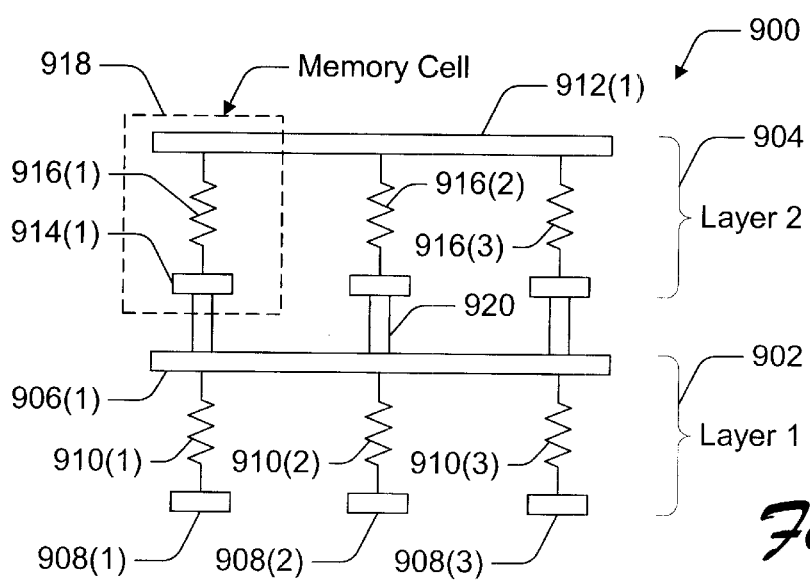

FIGS. 9A and 9B are schematics of an exemplary non-volatile, multi-level ROM device 900. The schematics illustrate memory device 900 having two layers, a first layer 902 and a second layer 904. The first layer 902 of memory device 900 has conductive traces that are formed as rows of conductive material 906(1–2) crossing over columns of conductive material 908(1–3).

The first layer 902 also has memory components 910(1–6) illustrated as resistor memory components in the schematic. Each memory component 910 is connected between a row of conductive material and a column of conductive material. For example, memory component 910(1) is connected between the row of conductive material 906(1) and the column of conductive material 908(1). The memory components illustrated in FIGS. 9A and 9B can be implemented with any of the exemplary memory components described herein, such as resistor memory component 104 as shown in FIG. 1, a resistor memory component 206 in series with a control element 208 as shown in FIG. 2, or an anti-fuse junction device 306 in series with a diode 308 as shown in FIG. 3. Those skilled in the art will recognize that many different combinations of materials and designs are available to fabricate the memory components.

Similarly, the second layer 904 has conductive traces that are formed as rows of conductive material 912(1–2) crossing over columns of conductive material 914(1–3). Memory components 916(1–6) are connected between a row of conductive material and a column of conductive material, which is designated as a memory cell. For example, memory cell 918 includes a memory component 916(1) connected between the row of conductive material 912(1) and the column of conductive material 914(1).

Each layer of memory device 900 has multiple memory cells, and each memory cell has a memory component. Each memory component has a determinable resistance value when a potential is applied across the memory component. The resistance value of any one memory component at any cross-point can be designed to be relatively high (e.g. 10 Meg ohms), which translates to a logic bit value of one, or relatively low (e.g. 100K ohms), which translates to a logic bit value of zero. Correlating a relatively high resistance memory component with a logic one, and a relatively low resistance memory component with a logic zero is an implementation design choice. Accordingly, a relatively high resistance memory component can be defined as a logic zero and a relatively low resistance memory component can be defined as a logic one.

The memory cells of the first layer 902 and the memory cells of the second layer 904 are electrically insulated with a non-conductive material 920. Although shown in the schematic as individual insulators 920 between memory cells, the non-conductive material 920 can be formed as a solid layer between the first layer 902 and the second layer 904.

To simplify the description, FIGS. 9A and 9B show only two layers of memory device 900 and only a few memory cells per layer that include a memory component between, or at a cross point of, a row conductive trace and a column conductive trace. Although not shown, the row conductive traces and/or the column conductive traces can also be vertically orientated. Those skilled in the art will appreciate that memory device 900 can be fabricated with any number of layers, and with any number of memory cells per layer to accommodate requests for smaller memory devices that provide more memory capacity.

Conclusion

Although the invention has been described in language specific to structural features and/or methods, it is to be understood that the invention defined in the appended claims is not necessarily limited to the specific features or methods described. Rather, the specific features and methods are disclosed as preferred forms of implementing the claimed invention.

What is claimed is:

1. A memory device, comprising:
   memory components each configured to represent a logic value corresponding to a data bit in a bit sequence, the memory components having an initial first resistance;
   a defective memory component having a second resistance and configured to represent a second logic value corresponding to a data bit in the bit sequence; and
   an additional memory component configured to represent an encode bit in the bit sequence, the encode bit associating the defective memory component with the bit sequence.

2. A memory device as recited in claim 1, wherein the additional memory component is further configured to represent an encode bit that indicates whether the bit sequence is inverted.

3. A memory device as recited in claim 1, wherein the additional memory component is further configured to represent an encode bit that indicates whether the logic state of each data bit in the bit sequence is inverted.

4. A memory device as recited in claim 1, wherein the memory components have an initial high resistance, and wherein the defective memory component has a low resistance.

5. A memory device as recited in claim 1, wherein the additional memory component has a high resistance that represents a logic one encode bit to indicate that the logic state of each bit in the bit sequence is inverted.

6. A memory device as recited in claim 1, wherein the additional memory component has a low resistance that represents a logic zero encode bit to indicate that the logic state of each bit in the bit sequence is not inverted.

7. A memory device as recited in claim 1, wherein the memory components are each further configured to represent an inverted logic value corresponding to a data bit in the bit sequence.

8. A memory device as recited in claim 1, wherein one or more of the memory components are further configured to be programmed to represent a logic zero corresponding to one or more logic zero data bits in the bit sequence.

9. A memory device as recited in claim 1, wherein one or more of the memory components are further configured to be converted to the second resistance to represent a logic zero corresponding to one or more logic zero data bits in the bit sequence.

10. A memory device as recited in claim 1, wherein one or more of the memory components are further configured to be programmed to represent a logic zero corresponding to one or more logic zero data bits in an inverted bit sequence, the inverted bit sequence formed by inverting the logic state of each data bit in the bit sequence.

11. A memory device as recited in claim 1, wherein the defective memory component is further configured to represent a logic zero corresponding to a logic zero data bit in the bit sequence.

12. A memory device as recited in claim 1, wherein the defective memory component is further configured to represent a logic zero corresponding to a logic zero data bit in an inverted bit sequence, the inverted bit sequence formed by inverting the logic state of each data bit in the bit sequence.

13. A memory device as recited in claim 1, wherein:
one or more of the memory components are further configured to be programmed to represent a logic zero corresponding to one or more logic zero data bits in an inverted bit sequence, the inverted bit sequence formed by inverting the logic state of each data bit in the bit sequence; and
the defective memory component is further configured to represent a logic zero corresponding to a logic zero data bit in the inverted bit sequence.

14. An integrated circuit comprising:
memory components each configured to represent a logic value corresponding to a data bit in a bit sequence, the memory components having an initial first resistance;
a defective memory component having a second resistance and configured to represent a second logic value corresponding to a data bit in the bit sequence; and
an additional memory component configured to represent an encode bit in the bit sequence, the encode bit associating the defective memory component with the bit sequence.

15. An electronic device, comprising:
one or more processors;
a memory device that includes memory cells each configured to store a logic value corresponding to a logic state of a data bit in a bit sequence; and
a data optimization application configured to execute on the one or more processors, and further configured to determine that a defective memory cell of the memory device is configured to store a second logic value corresponding to a data bit in the bit sequence.

16. An electronic device as recited in claim 15, wherein the data optimization application is further configured to store an encode bit in a memory cell of the memory device, the encode bit configured to indicate whether the bit sequence is inverted.

17. An electronic device as recited in claim 15, wherein the data optimization application is further configured to store an encode bit to indicate whether the logic state of each data bit in the bit sequence is inverted.

18. An electronic device as recited in claim 15, wherein the data optimization application is further configured to determine that the defective memory cell is configured to store a logic value corresponding to a logic zero data bit in the bit sequence.

19. An electronic device as recited in claim 15, wherein the data optimization application is further configured to invert the logic state of each data bit in the bit sequence such that a logic zero data bit is stored in the defective memory cell.

20. An electronic device as recited in claim 15, wherein the data optimization application is further configured to invert the logic state of each data bit in the bit sequence to form an inverted bit sequence such that a logic zero data bit in the inverted bit sequence is stored in the defective memory cell.

21. An electronic device as recited in claim 15, wherein the data optimization application is further configured to:
invert the logic state of each data bit in the bit sequence such that a logic zero data bit is stored in the defective memory cell; and
store an encode bit in a memory cell to indicate that the logic state of each data bit in the bit sequence is inverted.

22. An electronic device as recited in claim 15, wherein the data optimization application is further configured to:
read the bit sequence from the memory cells of the memory device;
determine from an encode bit whether the bit sequence is inverted; and
invert the logic state of each data bit in the bit sequence if the encode bit indicates that the bit sequence is inverted.

23. An electronic device as recited in claim 22, wherein the data optimization application is further configured to determine that the encode bit is a logic one which indicates that the logic state of each data bit in the bit sequence is inverted.

24. An electronic device as recited in claim 22, wherein the data optimization application is further configured to determine that the encode bit is a logic zero which indicates that the logic state of each data bit in the bit sequence is not inverted.

25. A portable computing device comprising:
one or more processors;
a memory device that includes memory cells each configured to store a logic value corresponding to a logic state of a data bit in a bit sequence; and
a data optimization application configured to execute on the one or more processors, and further configured to determine that a defective memory cell of the memory device is configured to store a second logic value corresponding to a data bit in the bit sequence.

26. A printing device comprising:
one or more processors;
a memory device that includes memory cells each configured to store a logic value corresponding to a logic state of a data bit in a bit sequence; and
a data optimization application configured to execute on the one or more processors, and further configured to determine that a defective memory cell of the memory device is configured to store a second logic value corresponding to a data bit in the bit sequence.

27. A method, comprising:
determining a logic state of a defective memory cell in a memory device; and
storing a bit sequence in memory cells of the memory device such that a data bit in the bit sequence having a logic value that corresponds to the defective memory cell logic state is stored in the defective memory cell.

28. A method as recited in claim 27, further comprising storing an encode bit in a memory cell of the memory device, the encode bit indicating that the bit sequence is not inverted.

29. A method as recited in claim 27, further comprising storing an encode bit as a logic zero to indicate that the logic state of each data bit in the bit sequence is not inverted.

30. A method as recited in claim 27, further comprising storing an encode bit in a memory cell of the memory device, the encode bit indicating that the bit sequence is inverted.

31. A method as recited in claim 27, further comprising storing an encode bit as a logic one to indicate that the logic state of each data bit in the bit sequence is inverted.

32. A method as recited in claim 27, further comprising inverting the logic state of each data bit in the bit sequence such that the data bit stored in the defective memory cell corresponds to the defective memory cell logic state.

33. A method as recited in claim 27, wherein storing includes programming one or more of the memory cells to correspond to logic zero data bits in the bit sequence.

34. A method as recited in claim 27, wherein storing includes programming one or more of the memory cells to correspond to logic zero data bits in the bit sequence, the one or more memory cells each having a high resistance memory component being converted to a low resistance memory component.

35. A method as recited in claim 27, further comprising inverting the logic state of each data bit in the bit sequence to form an inverted bit sequence such that a data bit in the inverted bit sequence stored in the defective memory cell corresponds to the defective memory cell logic state, and wherein storing includes programming the memory cells of the memory device to correspond to logic zero data bits in the inverted bit sequence.

36. A method as recited in claim 27, further comprising:
inverting the logic state of each data bit in the bit sequence such that the data bit stored in the defective memory cell corresponds to the defective memory cell logic state; and
storing an encode bit to indicate that the logic state of each data bit in the bit sequence is inverted.

37. A method as recited in claim 27, further comprising:
inverting the logic state of each data bit in the bit sequence such that the data bit stored in the defective memory cell corresponds to a logic zero; and
storing an encode bit as a logic one to indicate that the logic state of each data bit in the bit sequence is inverted.

38. A method as recited in claim 27, wherein determining includes determining that the defective memory cell has a low resistance memory component, and wherein storing includes storing a logic zero data bit of the bit sequence in the defective memory cell.

39. A method as recited in claim 27, further comprising inverting the logic state of each data bit in the bit sequence such that the data bit stored in the defective memory cell corresponds to a logic zero, and wherein determining includes determining that the defective memory cell has a low resistance memory component.

40. A method as recited in claim 27, further comprising:
reading the bit sequence from the memory cells of the memory device;
determining from an encode bit whether the logic state of each data bit in the bit sequence is inverted; and
inverting the logic state of each data bit in the bit sequence if the encode bit indicates that the logic state of each data bit in the bit sequence is inverted.

41. A method as recited in claim 40, wherein determining includes determining that the encode bit is a logic one which indicates that the logic state of each data bit in the bit sequence is inverted.

42. A method as recited in claim 40, wherein determining includes determining that the encode bit is a logic zero which indicates that the logic state of each data bit in the bit sequence is not inverted.

43. An electronic device, comprising:
means for determining that a defective memory cell in a memory device represents a logic state; and
means for storing a bit sequence in memory cells of the memory device such that a data bit in the bit sequence having a logic value that corresponds to the defective memory cell logic state is stored in the defective memory cell.

44. An electronic device as recited in claim 43, further comprising means for storing an encode bit that indicates whether the bit sequence is inverted.

45. An electronic device as recited in claim 43, further comprising means for storing an encode bit that indicates whether the logic state of each data bit in the bit sequence is inverted.

46. An electronic device as recited in claim 43, further comprising means for storing one or more encode bits that indicate whether the logic state of one or more data bits in the bit sequence are inverted.

47. An electronic device as recited in claim 43, further comprising means for inverting the logic state of each data bit in the bit sequence to form an inverted bit sequence such that a zero logic data bit of the inverted bit sequence is stored in the defective memory cell.

48. An electronic device as recited in claim 43, further comprising means for programming one or more of the memory cells that correspond to logic zero data bits in the bit sequence.

49. An electronic device as recited in claim 43, further comprising:
means for inverting the logic state of each data bit in the bit sequence to form an inverted bit sequence such that a zero logic data bit of the inverted bit sequence is stored in the defective memory cell;
means for programming one or more of the memory cells that correspond to logic zero data bits in the inverted bit sequence; and
means for storing an encode bit to indicate that the logic state of each data bit in the bit sequence is inverted.

50. An electronic device as recited in claim 43, further comprising:
means for reading the bit sequence from the memory cells of the memory device;
means for determining from an encode bit whether the bit sequence is inverted; and
means for inverting the logic state of each data bit in the bit sequence if the encode bit indicates that the bit sequence is inverted.

* * * * *